United States Patent [19]

Dukes

[11] Patent Number: 5,059,822
[45] Date of Patent: Oct. 22, 1991

[54] METHOD AND APPARATUS FOR CONTROLLING NOISE ON POWER SUPPLY BUSES

[75] Inventor: Glenn E. Dukes, Colorado Springs, Colo.

[73] Assignee: NCR Corporation, Dayton, Ohio

[21] Appl. No.: 617,846

[22] Filed: Nov. 23, 1990

[51] Int. Cl.[5] .................... H03K 17/16; H03K 19/003
[52] U.S. Cl. ...................................... 307/443; 307/440
[58] Field of Search ................................ 307/440, 443

[56] References Cited

U.S. PATENT DOCUMENTS 4,731,553  3/1988  Van Lehn et al. .................. 307/443
4,825,099  4/1989  Barton ................................. 307/270
4,906,866  3/1990  Alexander et al. ................. 307/443

OTHER PUBLICATIONS

"A 25-ns 4-Mbit CMOS SRAM with Dynamic Bit-Line Loads" by Fumio Miyaji, et al., IEEE Journal of Solid-State Circuits, vol. 24, No. 5, Oct. 1989, pp. 1213-1218.

Primary Examiner—David Mis
Attorney, Agent, or Firm—Stephen F. Jewett; Jack R. Penrod

[57] ABSTRACT

A method and apparatus for controlling ground bounce and transient noise induced in an integrated circuits power supply buses by feeding back the input/output power supply bus voltages levels and comparing those levels to the internal logic power supply bus voltage levels. Significant noise transients on the input/output upper potential power supply bus will increase a resistance of a series element in each buffer circuit that drives a respective output driver and thereby increase the overall switching time of each buffer and output driver combination. Similarly, significant ground bounce voltages on the input/output lower potential power supply bus will increase a resistance of another series element in each buffer circuit driving its respective output driver and thereby increase the overall switching time of each buffer and output driver combination. Increasing the switching time is known to reduce noise transients caused by switching currents, but by only increasing the switching time when the noise transients caused by switching currents reach a troublesome level, the remainder data switching of the output driver may be provided at a higher data rate.

7 Claims, 3 Drawing Sheets

METHOD AND APPARATUS FOR CONTROLLING NOISE ON POWER SUPPLY BUSES

BACKGROUND

The present invention relates to an integrated circuit, and more particularly to a method and apparatus for controlling a level of switching induced noise present on power supply buses of the integrated circuit.

In the integrated circuit technology, the overall trend is toward smaller, faster, and lower power logic gates. This allows the gates and their leads to be physically reduced in size, which in turn allows more logic gates to be manufactured per square inch of semiconductor material. Unfortunately, with respect to output devices the overall trend cannot be readily followed. This is primarily because of the relatively larger capacitances and inductances of the external conductors that connect the output devices to external logic inputs are not undergoing physical reduction to the same extent as the internal logic gates.

The result of this fact is that a significant proportion of each integrated circuit is occupied by output pad drivers in order to drive the connecting leads and external circuits. A related result is the fact that a very significant proportion of the current passing through the integrated circuit passes through the output pad drivers as an output current which the integrated circuit is sourcing or sinking.

Besides drawing a major portion of the current passing through an integrated circuit, many output pad drivers of many modern integrated circuits operate and draw their currents together. For example, sixteen output pad drivers may operate together to drive a sixteen bit wide address or data bus. Unfortunately, this means that groups of sixteen, thirty-two, or even sixty-four output pad drivers often are switching logic states at the same time. Such group switching may induce transient voltages on the integrated circuit's power bus conductors because of inherent current carrying limitations of physical size, parasitic inductances and resistances. Transient voltages especially may occur if a large majority of the group switches from one specific state, such as a logic HI, to the opposite state, that is logic LO. Because of the effect the transient voltages have on the output pad drivers, the known practice of separating the internal logic power supply buses from the input/output output power supply buses does not solve these problems.

The parasitic inductances and resistances, especially at very high switching speeds, may make these switching transients worse because of the their respective oppositions to changes in current. This opposition impedes the flow of current into the integrated circuit via the output pad driver power supply leads, resulting in a transient increase in voltage of the power supply's lower potential and a decrease in the voltage of the power supply's upper potential. The transient increase in the level of the lower potential of the power supply is commonly referred to as ground bounce, and the transient decrease in the upper potential of the power supply is commonly referred to as transient noise. Both types of transient voltages may cause problems and should be carefully managed, but because of the voltage definition for a logic LO is tighter than for a logic HI, ground bounce is more often the source of transient problems.

Power supply transient noise effects both the integrated circuit causing the noise and other integrated circuits to which it is connected. A transient bounce induced on the lower potential of an integrated circuit by output driver currents may induce false logic HIs to unrelated logic circuits that happen to share the same lower potential bus. This is why integrated circuits often have separate power supply buses for their internal logic gates and their output pad drivers. The output pad driver power supply buses, as is well known, are commonly used to sink any incoming surges on the integrated circuit input leads via protection diodes, thus the pad driver power supply buses are usually referred to as the input/output power supply buses. The separation of the internal power supply buses and the output pad driver buses allows the power supplies to have their upper and lower potential conductors connected together externally, where larger conductors and suppression capacitors may be used to reduce transient noise generated by the integrated circuit. Thus, noise can be suppressed and a common reference potential is provided to promote signal handling throughout among integrated circuits.

Externally, a subsequent integrated circuit receiving a binary output from a driver of an integrated circuit experiencing ground bounce may be driven with a false logic HI, or by a meta-voltage level that is greater than a logic LO but less than a logic HI. On the other hand, the next integrated circuit receiving an output from a driver of an integrated circuit experiencing upper potential noise transients may be driven with a false logic LO, or by a meta-voltage level that is less than a logic HI but greater than a logic LO. These are both undesirable situations, and the heretofore known solutions have led to significant further problems.

One previous solution to the transient noise problem for both internal and external logic circuits is to delay the time that the driver output binary value is considered valid until after transient voltages have settled down. This solution requires that any false binary states triggered during the delay either be cleared or be "don't care" logic signals. The problem with this approach is that it builds-in a predetermined delay into each and every binary output transfer. Such built-in delays are an impediment to the trend toward faster and faster data rates.

Another common solution is to delay the rate of change of the output drive current by changing the switching rate of the output driver. This solution always delays the rate of change of the output driver current as a way to prevent and/or reduce noise transients. Like the set delay approach, this solution inserts a switching delay, but it inserts them into the output drivers to reduce the switching rate that binary states are changing during an information transfer, and hence the amount of transient noise induced at the leading and trailing edges of data pulses, which is a major contributor to this type of transient noise. Additionally, by reducing the rate that the output current may change, often the amount of the ground bounce and the settling time of the ground bounce, as well as transient noise, are reduced. However, this second approach still delays the rate of change of every switching transition on the assumption that suppression of ground bounce and transient noise will always be needed. This, therefore is also an impediment to the trend toward faster switching times.

It is therefore an object of this invention to provide a ground bounce and transient noise reduction apparatus that only operates when needed to suppress problems with ground bounce and/or power conductor transient noise.

It is another object of this invention to provide a ground bounce and transient noise reduction apparatus that delays the rate of change of the output current as a function of the amount of ground bounce and/or transient noise in order to minimize the amount of delay required.

SUMMARY OF THE INVENTION

According to one aspect of the invention, the foregoing objects are achieved by providing separate upper and lower power supply buses for the internal logic devices including the output buffers that drive the output pad drivers, and the output pad drivers, and by using the difference between the internal logic power supply buses and the output driver buses as a control signal which is a function of the noise induced in the output driver buses by switching binary states. This control signal is fed back to control devices within the output buffers to controllably reduce the noise induced in the output driver buses by the output pad drivers switching binary states.

According to another aspect of the invention, the aforementioned objects are achieved by providing a noise reduction apparatus for an integrated circuit having internal power supply buses with upper and lower potentials, input/output power supply buses with upper and lower potentials, and an output pad driver. The noise reduction apparatus further includes a multi-stage, non-inverting buffer having a plurality of final stages. One of the final stages has a first inverter that is connected between the upper and lower potentials of the internal power supply buses. The first inverter has an output for driving a P-type transistor of the output pad driver. A second of the final stages has a second inverter that is connected between the upper and lower potentials of the internal power supply buses. The second inverter has an output for driving a N-type transistor of the output pad driver. A first feedback device is connected between the first inverter and the internal lower potential power supply bus for decreasing the rate of change of the output driving the P-type transistor of the output pad driver as the voltage level of the input/output upper potential power supply bus decreases with respect to the lower potential internal power supply bus. Similarly, a second feedback device is connected between the second inverter and the input/output lower potential power supply bus for decreasing the rate of change of the output driving the N-type transistor of the output pad driver as the voltage level of the input/output upper potential power supply bus decreases with respect to the input/output lower potential power supply bus. The noise reduction apparatus decreases the rate of change of the output voltages driving the output pad driver, which decreases the rate of change of the voltage level of the input/output upper potential power supply bus, thereby reducing the noise voltages generated by the output pad driver switching binary states.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DETAILED DESCRIPTION OF A PREFERRED EMBODIMENT

Figure 1:
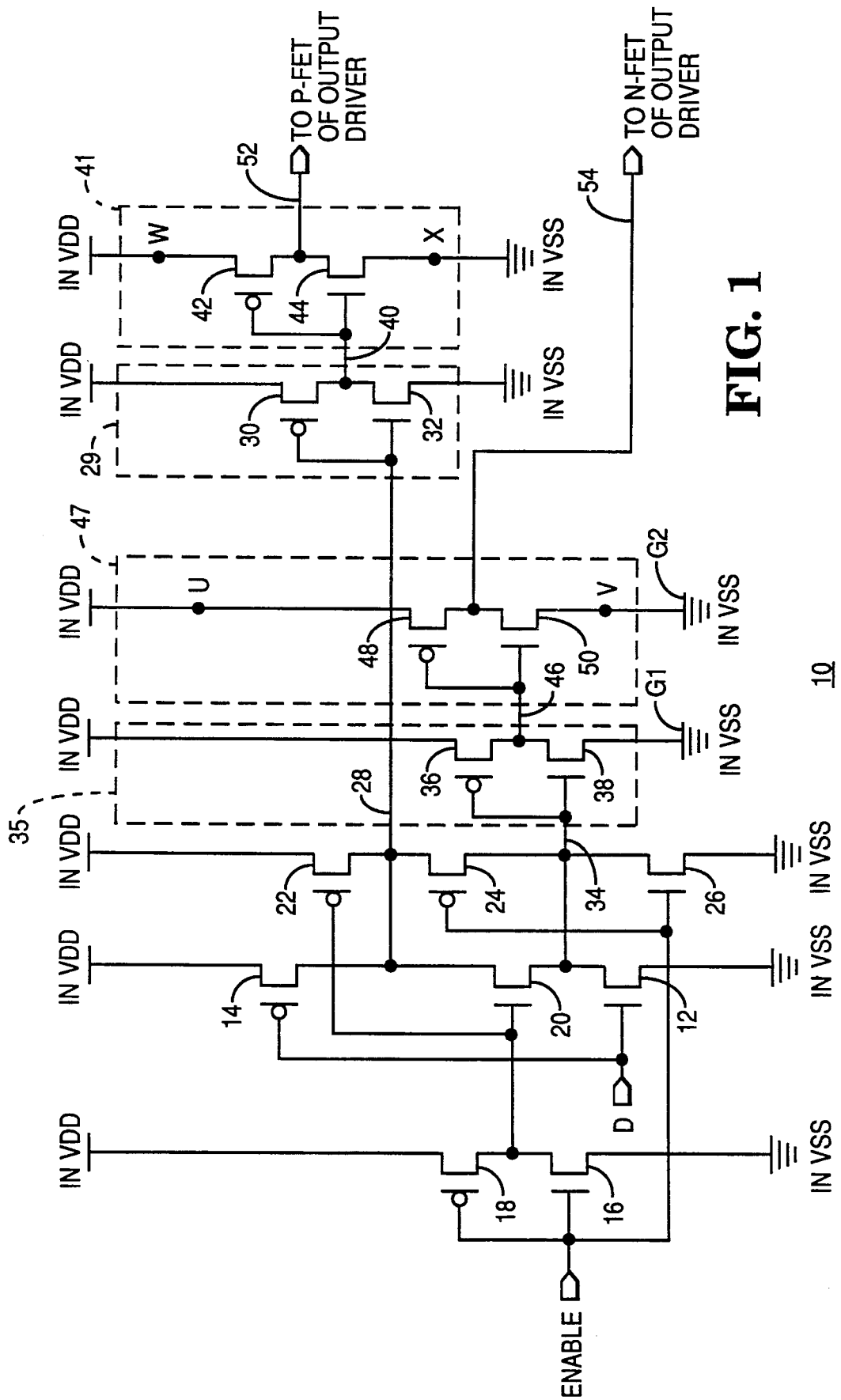
FIG. 1 is a schematic diagram a CMOS multi-stage output buffer known in the art.

Referring to FIG. 1, a known three stage output buffer 10 is shown. Input D is the buffer input as well as the input of the first stage. The first stage is made up of FETs 12, 14. Each of the FETs 12, 14 has its gate connected to input D to receive a logic signal to be outputted to an external conductor and/or component. Together FETs 12 and 14 form a well known CMOS inverter arrangement. The first stage is connected to an enable/disable network of FETs 16, 18, 20, 22, 24, and 26. When an ENABLE input is driven by an active LO, FETs 16 and 26 are turned OFF and FET 18 is turned ON. The voltage through FET 18 subsequently turns ON FET 20 and turns OFF FET 22. FET 24 is short circuited by turned ON FET 20. Even if the short circuit by FET 2) is not complete, FET 24 will be turned ON by the active LO ENABLE signal. Those skilled in the art will recognize that with FETs 22 and 26 turned OFF and FETs 20 and 24 turned ON, the output data of the first stage FETs 12, 14 propagates normally to essentially identical second stage inverters 29, 35 formed by FETs 30, 32, and 36, 38 respectively.

If, on the other hand, the ENABLE input is driven by a logic HI, then FETs 16 and 26 are turned ON and FET 18 is turned OFF. The voltage through FET 16 then turns ON FET 22 and turns OFF FETs 20 and 24. With FETs 22 and 26 turned ON, the output data from the first stage is disabled and overridden by the logic HI through FET 22 via line 28 to the second stage 29 and the logic LO through FET 26 via line 34 to the other second stage 35. The logic HI will be inverted by the second stage 29 to a logic LO which is outputted via line 40 to a third stage CMOS inverter 41 comprised of FETs 42, 44. Similarly, the second stage 35 will invert the logic LO on its input to a logic HI which is outputted via line 46 to another third stage CMOS inverter 47 comprised of FETs 48, 50. The output of CMOS inverter 41 will thus be a logic HI, and the output of CMOS inverter 47 will be a logic LO. These third stage outputs are respectively connected via lines 52 and 54 to a gate of a P-FET 60 and a gate of an N-FET 62 of an output driver 58 shown in FIG. 2. With the gate of P-FET 60 driven by a logic HI and the gate of N-FET 62 driven by a logic LO, the output driver 58 is driven into a high impedance output condition.

Referring again to FIG. 1, the binary operation of the output buffer 10 when the ENABLE input is active (i.e., the ENABLE input is a logic LO) will be described. Input D is connected to the gates of N-FET 12 and P-FET 14. N-FET 12 and P-FET 14 are connected in series between internal upper potential power supply bus, IN VDD, and internal lower potential power supply bus, IN VSS, in a CMOS inverter arrangement, except for the intervening N-FET 20 which is in series between N-FET 12 and P-FET 14. However, as mentioned previously, if the ENABLE input is driven to a logic LO, then N-FET 20 becomes substantially a short circuit, which results in this first stage being equivalent to a CMOS inverter stage. Furthermore, if the N-FET 20 is essentially a short circuit, that means that output lines 28 and 34 have substantially equivalent voltages and equivalent logic levels.

The gates of P-FET 30 and N-FET 32 of second stage 29 are connected in common to line 28. The P-FET 30 and the N-FET 32 are further connected in series between IN VDD and IN VSS in a CMOS inverter arrangement. The other second stage 35 is similarly arranged with the gates of P-FET 36 and N-FET 38 connected in common to line 34, and with P-FET 36 and N-FET 38 in series between IN VDD and IN VSS in a CMOS inverter arrangement. The outputs of second stages 29, 35 are taken from the junctions between the P-FETs 30, 36 and the N-FETs 32, 38 respectively. Lines 40, 46 respectively connect the outputs of second stages 29, 35 to third stages 41, 47.

The third stages 41, 47 are typical CMOS inverter stages and are substantially identical to the second stage CMOS inverters 29, 35. The third stage 41 is comprised of P-FET 42 and N-FET 44. The gates of P-FET 42 and N-FET 44 are connected in common and to line 40 from second stage 29. P-FET 42 and N-FET 44 are connected in series between IN VDD and IN VSS. The junction of the drains of this series connection is the output of the third stage 41, which is connected to line 52. Another third stage 47 is similarly arranged with the gates of P-FET 48 and N-FET 50 both connected to line 46, and the P-FET 48 connected in series with N-FET 50 IN VDD and IN VSS. The junction of the drains of P-FET 48 and N-FET 50 is the output of the third stage 47 and is connected to line 54. Lines 52 and 54 convey the output logic drive signals from the third stages 41, 47 to the output pad driver 58 shown in FIG. 2.

As mentioned previously, the inputs to stages 29 and 35 are logically identical when the ENABLE input is driven LO. Further, because the cascaded second and third stages 29, 41 are substantially the same as cascaded second and third stages 35, 47, the output drive signals on lines 52, 54 to output pad driver 58 will be substantially the same. Thus, output pad driver 58 is essentially a CMOS inverter when driven by output buffer 10 with an active LO on its ENABLE input. With the three stages of logical inversion provided by output buffer 10 and the logical inversion of the output pad driver 58, the logic signal conveyed by output line 64 to output pad 66 is a non-inverted version of the logic signal on data input D delayed by the propagation delay of four inverters.

Figure 2:
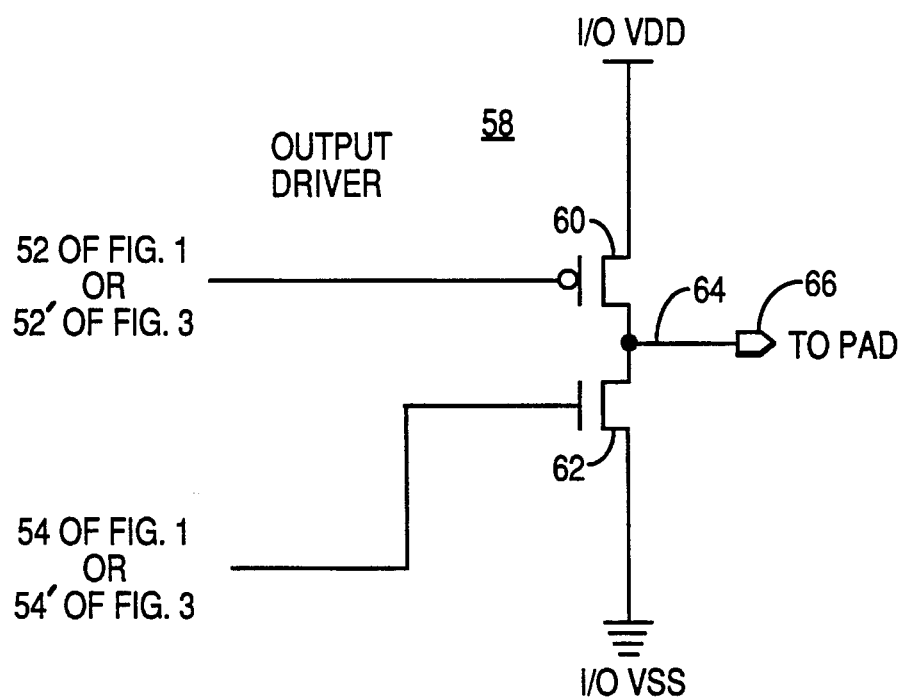
FIGS. 2 is a schematic diagram of a known CMOS output pad driver of a type conventionally driven by the buffer shown in FIG. 1.

As shown in FIG. 2, output pad driver 58 is comprised of a series connection of a P-FET 60 and an N-FET 62; however, instead of connecting between IN VDD and IN VSS, the series combination of P-FET 60 and N-FET 62 connect between an input/output upper potential power supply bus, I/O VDD, and an input/output lower potential power supply bus, I/O VSS. The reason for the separate power supply potentials I/O VDD and I/O VSS is to separate the internal logic circuits, including output buffer 10, from ground bounce and transient noise induced in the input/output power supply buses when a group of output pad drivers, e.g., a number of output pad drivers 58, changes logical states at the same time. However, the internal power supply buses IN VDD and IN VSS must connect to the input/output power supply buses I/O VDD and I/O VSS, either on the integrated circuit chip or at an some off chip location, in order for buffer 10 to have a common reference level from which to drive output pad driver driver 58. Even with such a connection may still induce some difficult ground bounce and transient noise voltages in the internal power supply buses. Moreover, such voltages may force a designer to either include a settling period for the ground bounce and power supply transients to die out, or some type of error correction apparatus to cope with the bit error rate induced by the noise voltages.

Figure 3:
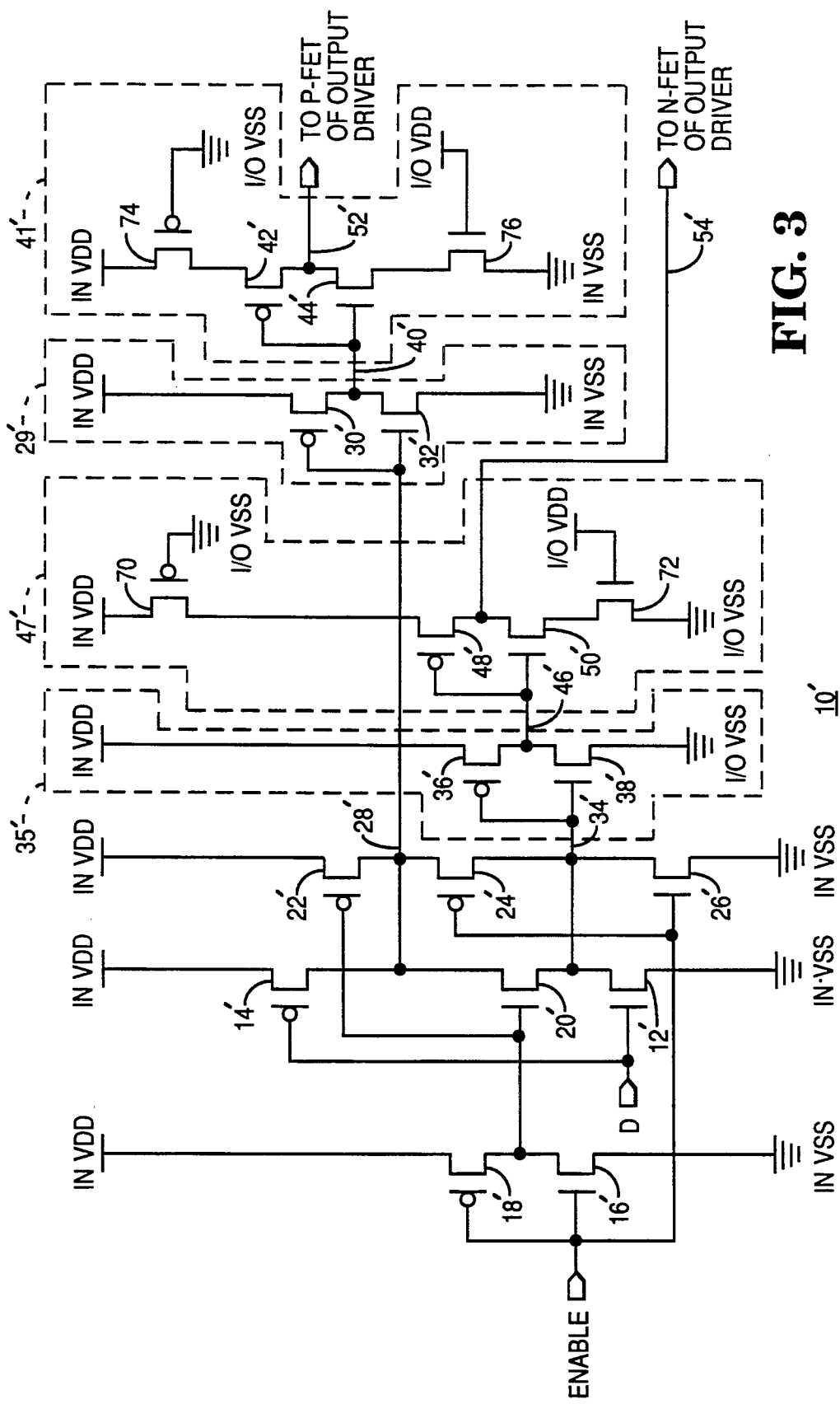
FIG. 3 is a schematic diagram of a CMOS multi-stage output buffer according to one embodiment of the invention.

Referring now to FIGS. 1 and 3, an embodiment of a noise reducing apparatus will be described. Buffer 10' has an ENABLE circuit including FETs 16, 18, 20, 22, 24, and 26 that is functionally identical to the ENABLE circuit of the buffer circuit 10 shown in FIG. 1. Also, the first stage, which is made up of FETs 12, 14 is functionally identical to the first stage of the buffer circuit 10 shown in FIG. 1.

Second stage 35' has a P-FET 36' connected in series between IN VDD and an N-FET 38' just like corresponding second stage 35 shown in FIG. 1, except that second stage 35' has the other end of the series connection of FETs 36', 38' connected to I/O VSS as its lower potential power supply bus. Third stage 47', like second stage 35', is connected to I/O VSS as its lower potential power supply bus. Thus the stages 35', 47' driving the output driver stage 58, shown in FIG. 2, are connected to I/O VSS just as N-FET 62 is. By this connection, any ground bounce increase in the I/O VSS voltage with respect to the IN VSS voltage level will cause a gain reduction of N-FETs 38', 50', and 62 because the ground bounce reduces their respective gate-to-source voltages. The gain reduction of FETs 38' and 50' lengthens the time required by stages 35' and 47' to switch logic states. By lengthening the output switching times, these gain reductions reduce some of the ground bounce. The longer time generates fewer high frequency components which interact with the parasitic inductances and parasitic capacitances. Additionally, lengthening the switching time provides more settling time for the output pad driver 58 only when ground bounce is occurring, and not when ground bounce is not occurring.

Besides the negative feedback and gain reduction that the ground bounce on I/O VSS provides to FETs 38' and 50', third stages 47' and 41' have additional components which provide additional negative feedback to reduce the switching rate of the output driver stage 58 (shown in FIG. 2) even more, and thereby reduce both ground bounce on I/O VSS and transient noise on I/O VDD, as will be explained below.

Returning to the input stage, the outputs of FETs 12 and 14 are connected via lines 28 and 34 to second stages 29' and 35' respectively. Second stage 29' with its FETs 30' and 32' is functionally identical to second stage 29 shown in FIG. 1. The second stage outputs are connected via 40' :nd 46' to third stages 41' and 47' respectively in the same manner that the second stages 29, 34 are connected to the third stages 41, 47 of buffer 10 shown in FIG. 1.

Third stages 41' and 47', with FETs 42', 44', 48', 50', are functionally identical to third stages 41 and 47, except that at the points designated U, V, W, and X in FIG. 1 third stages 41' and 47' have additional FETs 70, 72, 74, and 76 respectively. FETs 70, 74 are P-FETs, having their sources connected to IN VDD, their gates connected to I/O VSS, and their drains connected in series with the sources of FETs 42', 48' respectively. N-FET 76 has its source connected to IN VSS, its gate connected to I/O VDD, and its drain connected in series with the source of FET 44'. N-FET 72 has its source connected to I/O VSS in order to reduce the gain of stage 47' in case of ground bounce, as mentioned previously. N-FET 72 has its gate connected to I/O VDD and its drain connected in series with the source of FET 50' in a manner similar to the connection of N-FET 76 of third stage 41'. The output of third stage 41' is connected from the junction of FETs 42' and 44' via line 52' to the P-FET 60 of output driver 58 shown in FIG. 2. Similarly, the output of third stage 47' is connected from the junction of FETs 48' and 50' via line 54' to the N-FET 62 of the output driver 58.

In operation with their gates connected to I/O VSS and their sources connected to IN VDD, P-FETs 70 and 74 normally are turned completely ON and provide a low series resistances equal to their characteristic ON resistances between IN VDD and the rest of the third stages 41' and 47'. If the lower potential bus, I/O VSS, of the input/output power supply is instantaneously overloaded by a group of output pad drivers 58 switching logic levels causing a ground bounce thereon, P-FETs 70 and 74 will have their gate-to-source voltages reduced. If the gate-to-source voltage reductions are small, the ON resistances of P-FETs 70 and 74 will remain initially unchanged; however, as the gate-to-source voltage is reduced further, the ON resistances of P-FETs 70 and 74 will subsequently increase. Increases of the ON resistances of P-FETs 70 and 74 slow down the switching rates of third stages 41' and 47' and reduce any noise caused by the instantaneous overload of I/O VSS. If there is no substantial noise on I/O VSS, then P-FETs 70 and 74, then the switching rate of third stages 41' and 47' is not slowed down.

N-FET 76 with its gate connected to I/O VDD and its source connected to IN VSS and N-FET 72 with its gate connected to I/O VDD and its source connected to I/O VSS provide operations similar to that provided by P-FETs 70 and 74. Connected in this manner, N-FETs 72 and 76 are normally turned completely ON and provide a low series resistances equal to their characteristic ON resistances between I/O VSS and IN VSS, respectively, and the rest of the third stages 41' and 47'. If the upper potential of the input/output power supply bus, I/O VDD, is instantaneously overloaded by a group of output pad drivers 58 switching logic levels causing a noise transient thereon, N-FETs 72 and 76 will have their gate-to-source voltages reduced. If the gate-to-source voltage reductions are small, the ON resistances of N-FETs 72 and 76 will remain initially unchanged; however, as the gate-to-source voltage is reduced further, the ON resistances of N-FETs 72 and 76 will subsequently increase. Increases of the ON resistances of N-FETs 72 and 76 slow down the switching rates of third stages 41' and 47' and reduce any noise caused by the instantaneous overload of I/O VDD. If there is no substantial noise on I/O VDD, then N-FETs 72 and 76, then the switching rate of third stages 41' and 47' is not slowed down.

The P-FETs 70 and 74 will thereby temporarily limit the switching rate if substantial ground bounce is present on I/O VSS, and N-FETs 72 and 76 will thereby temporarily limit the switching rate if substantial transient noise is present on I/O VDD. The limiting characteristics of the P-FETs 70 and 74, and the N-FETs 72 and 76 are predetermined during fabrication by varying their critical dimensions. Thus, the output buffer 10' may be operated at very high switching rates in the absence of transient noise and ground bounce, on the one hand, or operated at a self-reduced switching rate in the presence of substantial transient noise and ground bounce. By reducing it switching rate, the instantaneous overload on I/O VDD and I/O VSS is reduced, thereby reducing conditions that might cause binary bit errors.

Thus, it will now be understood that there has been disclosed an apparatus which reduces the ground bounce and transient noise voltages caused by the output drivers of an integrated circuit. While the invention has been particularly illustrated and described with reference to a preferred embodiment thereof, it will be understood by those skilled in the art that various changes in form, details, and applications may be made therein. For example, this invention could be modified to operate with BiCMOS, TTL, and other logic families. It is accordingly intended that the appended claims shall cover all such changes in form, details and applications which do not depart from the true spirit and scope of the invention.

What is claimed as new and desired to be secured by Letters Patent of the United States is:

1. A noise reduction apparatus for use with a buffer having an output stage connected to a pad driver, said buffer being within an integrated circuit having internal upper potential and lower potential power supply buses and input/output upper potential and lower potential power supply buses, comprising:

first means connected to the output stage for reducing a current from the internal upper potential power supply bus via the output stage to the pad driver if a potential difference between the input/output lower potential power supply bus and the internal upper potential power supply bus decreases; and second means connected to the output stage for reducing a second current from the internal lower potential power supply bus via the output stage to the pad driver if a potential difference between the input/output upper potential power supply bus and said internal lower potential power supply bus decreases;

whereby noise is reduced by the first means reducing the first current driving the pad driver if ground bounce noise is occurring on the input/output lower potential power supply bus connected to the pad driver and by the second means reducing the second current driving the pad driver if transient noise is occurring on the input/output upper potential power supply bus connected to the pad driver.

2. The noise reduction apparatus as set forth in claim 1, wherein the first means includes a P-FET connected between the internal upper potential power supply bus and the output stage and the second means includes an N-FET connected between the internal lower potential power supply bus and the output stage.

3. A noise reduction apparatus for an integrated circuit having internal upper potential and lower potential power supply buses, input/output upper potential and lower potential power supply buses and an output pad driver, comprising:

a buffer having a plurality of final stages;

a first final stage of the buffer having a first inverter that is connected between the internal upper potential and lower potential power supply buses, the first inverter having an output for driving a P-type transistor of the output pad driver;

a second final stage of the buffer having a second inverter that is connected between the internal upper potential and lower potential power supply buses, the second inverter having an output for driving an N-type transistor of the output pad driver;

first feedback means connected between the first inverter and the internal lower potential power supply bus for decreasing a rate of change of an output drive signal driving the P-type transistor of the output pad driver as a voltage level of the input/output upper potential power supply bus decreases with respect to the internal lower potential power supply bus; and second feedback means connected between the second inverter and the input/output lower potential power supply bus for decreasing a rate of change of an output drive signal driving the N-type transistor of the output pad driver as a voltage level of the input/output upper potential power supply bus decreases with respect to the input/output lower potential power supply bus;

whereby decreasing the rates of change of the output driving signals driving the output pad driver decreases the rate of change of the voltage level of the input/output upper potential power supply bus to reduce noise voltages generated by switching of the output pad driver.

4. The noise reduction apparatus for an integrated circuit as set forth in claim 3, wherein:

the first feedback means connected between the first inverter and the internal lower potential power supply includes a first N-channel FET connected in series with the first inverter the first N-channel FET having its drain connected to said first inverter, a source connected to the internal lower potential power supply bus, and a gate connected to the input/output upper potential power supply bus; and the second feedback means connected between the second inverter and the internal lower potential power supply bus includes a second N-channel FET connected in series with the second inverter;

the second N-channel FET having its drain connected to the second inverter, a source connected to the internal lower potential power supply bus, and a gate connected to the input/output lower potential power supply bus;

whereby the first and second N-channel FETs during steady state conditions have low drain-to-source resistances which increase as the gate-to-source voltages of the first and second N-channel FETs decrease.

5. The noise reduction apparatus for an integrated circuit as set forth in claim 3, further comprising:

third feedback means connected between the first inverter and the internal upper potential power supply bus for decreasing the rate of change of the output drive signal driving the P-type transistor of the output pad driver as a voltage level of the input/output lower potential power supply bus increases with respect to the internal upper potential power supply bus; and fourth feedback means connected between the second inverter and the internal upper potential power supply bus for decreasing the rate of change of the output drive signal driving the N-type transistor of the output pad driver as the voltage level of the input/output lower potential power supply bus increases with respect to the internal upper potential power supply bus;

whereby decreasing the rates of change of the output signals driving the output pad driver decreases the rate of change of the voltage level of the input/output lower potential power supply bus to reduce noise voltages induced by the switching of the output pad driver.

6. The noise reduction apparatus for an integrated circuit as set forth in claim 5, wherein:

the third feedback means connected between the first inverter and the internal upper potential power supply bus includes a first P-channel FET connected in series with the first inverter;

the first P-channel FET having its drain connected to the first inverter, a source connected to the internal upper potential power supply bus, and a gate connected to the input/output lower potential power supply bus; and the fourth feedback means connected between the second inverter and the internal upper potential power supply includes a second P-channel FET connected in series with the second inverter;

the second P-channel FET having its drain connected to the second inverter, a source connected to the internal upper potential power supply bus, and a gate connected to the input/output lower potential power supply bus;

whereby the first and second P-channel FETs during steady state conditions have low drain-to-source resistances which increase as their respective gate-to-source voltages decrease.

7. A method for reducing noise for use with a buffer having an output stage connected to a pad driver, said buffer being within an integrated circuit having internal upper potential and lower potential power supply buses and input/output upper potential and lower potential power supply buses, comprising the steps of:

reducing a current from the internal upper potential power supply bus via the output stage to the pad driver if a potential difference between the input/output lower potential bus and the internal upper potential power supply bus decreases; and reducing a second current from the internal lower potential power supply bus via the output stage to the pad driver if a potential difference between the input/output upper potential bus and the internal lower potential power supply bus decreases.

* * * * *